(12) United States Patent
Ichihashi et al.

(10) Patent No.: US 7,052,989 B2
(45) Date of Patent: May 30, 2006

(54) SEMICONDUCTOR DEVICE HAVING OPENING AND METHOD OF FABRICATING THE SAME

(75) Inventors: Yoshinari Ichihashi, Gifu (JP); Takashi Goto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 88 days.

(21) Appl. No.: 10/624,540

(22) Filed: Jul. 23, 2003

(65) Prior Publication Data

US 2004/0048489 A1  Mar. 11, 2004

Related U.S. Application Data

(62) Division of application No. 09/788,673, filed on Feb. 21, 2001, now abandoned.

(30) Foreign Application Priority Data

Feb. 23, 2000  (JP) ............................... 2000-45580

(51) Int. Cl.
*H01L 21/44* (2006.01)

(52) U.S. Cl. .............. 438/637; 438/668; 438/672; 438/675; 438/709; 438/712

(58) Field of Classification Search ............... 438/634, 438/637, 649, 655, 656, 672, 675, 709, 710, 438/667, 668, 712
See application file for complete search history.

(56) References Cited

U.S. PATENT DOCUMENTS 6,017,784 A   1/2000  Ohta et al.
6,080,648 A * 6/2000  Nagashima ............... 438/592
6,281,562 B1 * 8/2001  Segawa et al. ............ 257/510
6,300,683 B1 * 10/2001 Nagasaka et al. .......... 257/774
6,326,270 B1 * 12/2001 Lee et al. .................. 438/279
6,512,299 B1   1/2003  Noda

FOREIGN PATENT DOCUMENTS

| JP | 8-250449 | 9/1996 |
| JP | 9-237832 | 9/1997 |
| JP | 10-261628 | 9/1998 |
| JP | 11307516 A | 11/1999 |

* cited by examiner

*Primary Examiner*—Minh-Loan Tran
(74) *Attorney, Agent, or Firm*—McDermott Will & Emery LLP

(57) ABSTRACT

A semiconductor device capable of compatibly suppressing a microloading effect (irregular etching) and over-etching also in formation of a fine contact hole requiring a high aspect ratio is obtained. This semiconductor device comprises a first conductive part, an insulator film having an opening formed on the first conductive part and a second conductive part electrically connected with the first conductive part through the opening. The insulator film includes an upper insulator film and a lower insulator film, stacked/formed at least around a connection part between the first conductive part and the second conductive part, consisting of different materials. Thus, when employing a material having a higher etching selection ratio than the upper insulator film for the lower insulator film, the first conductive part is prevented from over-etching also when etching is performed through a high-concentration plasma device with which a high etching selection ratio of the first conductive part is hard to attain for suppressing a microloading effect (irregular etching).

12 Claims, 3 Drawing Sheets

SEMICONDUCTOR DEVICE HAVING OPENING AND METHOD OF FABRICATING THE SAME

This application is a divisional of application Ser. No. 09/788,673 filed Feb. 21, 2001 now abandoned.

BACKGROUND OF THE INVENTION

1. Field of the Invention

The present invention relates to a semiconductor device and a method of fabricating the same, and more particularly, it relates to a semiconductor device having an opening and a method of fabricating the same.

2. Description of the Prior Art

Following recent improvement of the degree of integration of semiconductor devices, refinement of semiconductor elements loaded on semiconductor devices gets more and more important. Such refinement of the semiconductor elements results in a new problem of electric resistance of each element electrode and dispersion of the resistance. In a MOS transistor, for example, each of gate, source and drain electrodes itself has high wiring resistance and high parasitic resistance. Following the aforementioned refinement, unignorable wiring delay and conductance deterioration result from the electric resistance of each electrode.

In general, therefore, a technique of bringing the surfaces of gate, source and drain electrodes into a silicide structure obtained by combining the electrode material (silicon) with a metal element thereby reducing wiring delay and conductance deterioration is put into practice. Further, the so-called salicide (self-aligned silicide) structure selectively forming silicide layers on the surfaces of the gate, source and drain electrodes in a self-aligned manner is also frequently employed in recent years.

In a general fabrication process for the salicide structure, spacers of silicon ($SiO_2$) are first formed on the side surfaces of the gate electrode of polycrystalline silicon. Thereafter a metal is deposited on the overall surface of the element and thereafter heat-treated for silicifying the surfaces of the gate, source and drain electrodes in a self-aligned manner. Then, the remaining unreacted metal part is removed. Thus, the salicide structure is formed.

The aforementioned problem of electric resistance can be avoided by employing the salicide structure. When a contact hole (opening) is formed in an interlayer isolation film for connecting each electrode of the aforementioned salicide structure with a wire, however, the following problem arises:

Following the aforementioned refinement of the element, the contact hole is required to have a high aspect ratio. In generally employed etching with $CHF_3$ gas or $CF_4$ gas through a low-concentration plasma device, however, it is difficult to suppress a microloading effect (irregular etching) as the aspect ratio of the contact hole is increased. In etching with $CHF_3$ gas or $CF_4$ gas through a high-concentration plasma device, on the other hand, the microloading effect (irregular etching) can be suppressed.

In the etching through a high-concentration plasma device, however, it is difficult to set the concentration of $CF_2$ or $CF_3$, which is a polymer precursor in the plasma of the etching gas, to a value capable of ensuring a high etching selection ratio of the base salicide structure. Therefore, the surfaces of the electrodes of the salicide structure are disadvantageously scraped off by the etching.

FIG. 7 is a sectional view for illustrating the problem caused when forming contact holes by conventional etching with $CHF_3$ gas or $CF_4$ gas through a high-concentration plasma device. Referring to FIG. 7, an element isolation film 112 is formed on a prescribed region of the surface of a semiconductor substrate 101 in a conventional semiconductor device. A source electrode 102 and a drain electrode 103 serving as impurity active regions are formed on an active region (element forming region) enclosed with the element isolation film 112 at a prescribed interval to hold a channel region 104 therebetween. A gate electrode 106 is formed on the channel region 104 through a gate insulator film 105. Salicide layers 102s, 103s and 106s are formed on the surfaces of the source electrode 102, the drain electrode 103 and the gate electrode 106 respectively. Further, an interlayer isolation film 109 of silicon oxide ($SiO_2$) is formed to cover the overall surface. The interlayer isolation film 109 is formed with contact holes 110 reaching the source electrode 102, the drain electrode 103 and the gate electrode 106 respectively.

When the contact holes 110 are formed in the interlayer isolation film 109 by etching with $CHF_3$ gas or $CF_4$ gas through a high-concentration plasma device in order to suppress a microloading effect (irregular etching) in this structure, the surfaces of the electrodes 102, 103 and 106 having the salicide structure are also etched. This is because it is difficult to set the concentration of $CF_2$ or $CF_3$, which is a polymer precursor in the plasma of the etching gas, to a value capable of ensuring a high etching selection ratio of the base salicide layers 102s, 103s and 106s, as hereinabove described.

As described above, it is generally difficult to compatibly suppress the microloading effect (irregular etching) and over-etching in formation of the contact holes 110 requiring a high aspect ratio. This problem is not restricted to the case of forming contact holes on a salicide structure but similarly arises also in formation of contact holes provided in an insulator film for attaining electrical contact between a lower conductive part and an upper conductive part.

SUMMARY OF THE INVENTION

An object of the present invention is to provide a semiconductor device capable of compatibly suppressing a microloading effect (irregular etching) and over-etching in formation of a fine contact hole requiring a high aspect ratio.

Another object of the present invention is to provide a semiconductor device capable of automatically reducing an etching rate before an opening reaches a lower conductive part.

Still another object of the present invention is to provide a method of fabricating a semiconductor device capable of compatibly suppressing a microloading effect (irregular etching) and over-etching.

A semiconductor device according to an aspect of the present invention comprises a first conductive part, an insulator film having an opening formed on the first conductive part and a second conductive part electrically connected to the first conductive part through the opening, and the insulator film includes an upper insulator film and a lower insulator film, stacked/formed at least around a connection part between the first conductive part and the second conductive part, consisting of different materials.

In the semiconductor device according to the aforementioned aspect, the upper insulator film and the lower insulator film consisting of different materials are stacked/formed at least around the connection part between the first conductive part and the second conductive part, so that the etching rate is automatically reduced when etching for forming the opening reaches the lower insulator film from the upper insulator film if the lower insulator film is prepared from a material having a higher etching selection ratio than the upper insulator film, for example. Thus, also when employing etching through a high-concentration plasma device with which a high etching selection ratio of the first conductive part is hard to attain for suppressing a microloading effect (irregular etching), the first conductive part can be prevented from over-etching. Consequently, a semiconductor device capable of compatibly suppressing the microloading effect and over-etching in formation of a fine contact hole requiring a high aspect ratio can be provided.

In the semiconductor device according to the aforementioned aspect, the lower insulator film preferably contains a material having a higher etching selection ratio than the upper insulator film. Thus, the etching rate can be readily automatically reduced when etching for forming the opening reaches the lower insulator film from the upper insulator film.

The etching rate is automatically reduced when the etching reaches the lower insulator film from the upper insulator film for the following reason: It is well known that anisotropy of etching for vertically forming an opening in an insulator film is improved by performing the etching with formation of a side wall protective film on the inner peripheral surface of the opening. This side wall protective film is formed by an etched member, a polymerization film from the etching gas component or a reaction product thereof adhering to the inner peripheral surface of the opening. The side wall protective film has an effect of hindering transverse progress of the etching. It has been confirmed that an effect similar to this side wall protection effect is attained also when vertically progressing etching reaches a member (having a high selection ratio) harder to etch than the insulator film to be etched. In other words, a film similar to the aforementioned side wall protective film tends to be formed also on the upper surface of the lower insulator film having a high etching selection ratio. According to the present invention, the lower insulator film having a high etching selection ratio is provided under the upper insulator film through the aforementioned property, whereby the first conductive part can be prevented from over-etching also when etching is performed through a high-concentration plasma device with which a high etching selection ratio of the first conductive part is hard to attain for suppressing the microloading effect (irregular etching).

In this case, the first conductive part preferably contains a material having a higher etching selection ratio than the lower insulator film. Thus, the first conductive part can be more effectively prevented from over-etching. In this case, the first conductive part may include a silicified element electrode, the lower insulator film may include a silicon nitride film, and the upper insulator film may include a silicon oxide film. Further, the element electrode may include a silicified gate electrode, a silicified source electrode and a silicified drain electrode.

In the aforementioned case, the silicon nitride film is formed to be in contact with areas of the surfaces of the silicified electrodes except those exposed in the opening. Thus, the etching rate is further reduced by the surfaces of the silicified electrodes immediately after being reduced by the silicon nitride film. Therefore, the surfaces of the silicified electrodes can be more effectively prevented from over-etching. In the aforementioned case, the lower insulator film may include an SOG film.

A method of fabricating a semiconductor device according to another aspect of the present invention comprises steps of forming an insulator film including a multilayer film of an upper insulator film and a lower insulator film having a higher etching selection ratio than the upper insulator film on a first conductive part, etching the insulator film thereby forming an opening reaching the first conductive part, and forming a second conductive part connected with the first conductive part through the opening.

In the method of fabricating a semiconductor device according to the aforementioned aspect, the insulator film including the multilayer film of the upper insulator film and the lower insulator film having a higher etching selection ratio than the upper insulator film is etched for forming the opening reaching the first conductive part, so that the etching rate is automatically reduced when etching for forming the opening reaches the lower insulator film from the upper insulator film. Thus, also when employing etching through a high-concentration plasma device with which a high etching selection ratio of the first conductive part is hard to attain for suppressing a microloading effect (irregular etching), the first conductive part can be prevented from over-etching. Consequently, the microloading effect and over-etching can be compatibly suppressed in formation of a fine contact hole requiring a high aspect ratio.

In the method of fabricating a semiconductor device according to the aforementioned aspect, the first conductive part preferably contains a material having a higher etching selection ratio than the lower insulator film. Thus, the first conductive part can be more effectively prevented from over-etching.

The method of fabricating a semiconductor device according to the aforementioned aspect may preferably further comprise a step of silicifying the first conductive part in advance of the step of forming the insulator film. Thus, the silicified surface has a higher etching selection ratio than the lower insulator film, whereby the first conductive part can be more effectively prevented from over-etching. In this case, the first conductive part may include a gate electrode, a source electrode and a drain electrode, and the step of silicifying the first conductive part may include a step of silicifying the surfaces of the gate electrode, the source electrode and the drain electrode. Thus, the silicified surfaces of the gate, source and drain electrodes of the semiconductor device can be more effectively prevented from over-etching in etching for forming the opening.

In the method of fabricating a semiconductor device according to the aforementioned aspect, the lower insulator film preferably includes a silicon nitride film, the upper insulator film preferably includes a silicon oxide film, and the step of forming the opening preferably includes a step of forming the opening by etching the upper insulator film and the lower insulator film by dry etching with gas having a composition of $C_xH_yF_z$. In this case, the gas consisting of $C_xH_yF_z$ preferably includes gas consisting of $C_4H_8$.

In this case, further, the silicon nitride film forming the lower insulator film is preferably formed to be in contact with the surface of the first conductive part. Thus, the surface of the first conductive part is exposed immediately after the etching rate is reduced by the silicon nitride film in etching for forming the opening, whereby the surface of the first conductive part can be prevented from over-etching.

In the method of fabricating a semiconductor device according to the aforementioned aspect, the step of forming the opening is preferably carried out by dry etching through a high-concentration plasma device. Further, the lower insulator film may include an SOG film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

Figure 1:
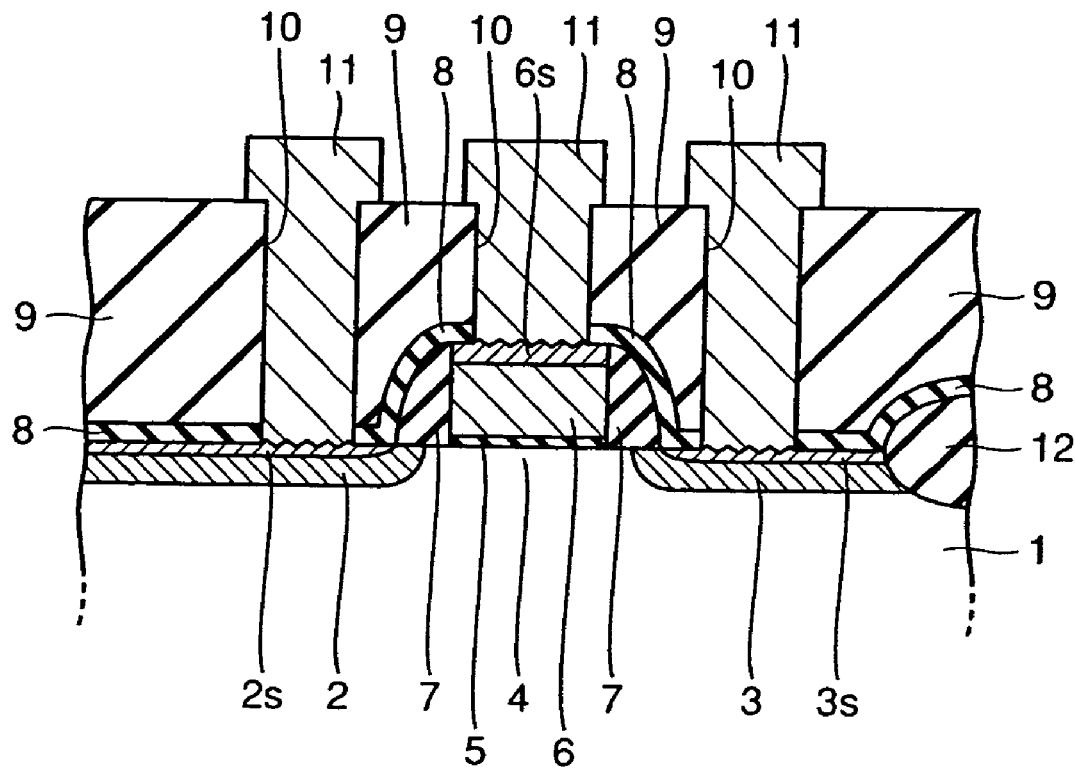
FIG. 1 is a sectional view showing the structure of a semiconductor device according to an embodiment of the present invention.

FIG. 1 shows an embodiment of the inventive semiconductor device, which is applied to a MOS transistor. In the MOS transistor according to this embodiment, an element isolation film 12 is formed on a prescribed region of the surface of a semiconductor substrate 1 of silicon. A source electrode 2 and a drain electrode 3 serving as impurity active regions are formed on an active region (element forming region) enclosed with the element isolation film 12 at a prescribed interval to hold a channel region 4 therebetween. A gate electrode 6 is formed on the channel region 4 through a gate insulator film 5.

Salicide layers 6s, 2s and 3s are formed on the surfaces of the gate electrode 6, the source electrode 2 and the drain electrode 3 in thicknesses of at least 5 nm respectively. Spacers 7 of silicon oxide ($SiO_2$) are formed on the side surfaces of the gate electrode 6. A silicon nitride film (SiN) 8 is formed in a thickness of at least 5 nm, to cover the spacers 7. The silicon nitride film 8 is formed to cover the overall surface except regions formed with contact holes 10. More specifically, the silicon nitride film 8 is also formed on regions of the surfaces of the salicide layers 6s, 2s and 3s except those exposed through the contact holes 10.

On the silicon nitride film 8, an interlayer isolation film 9 of silicon oxide ($SiO_2$) is formed in a thickness of at least 10 nm to cover the overall surface. The contact holes 10 reaching the surfaces of the gate electrode 6, the source electrode 2 and the drain electrode 3 respectively are formed in the interlayer isolation film 9. Wires 11 are connected to the gate electrode 6, the source electrode 2 and the drain electrode 3 having a salicide structure through the contact holes 10 respectively.

The aforementioned spacers 7 of silicon oxide ($SiO_2$) are provided for bringing only the upper surface of the gate electrode 6 and only necessary regions of the source electrode 2 and the drain electrode 3 into salicide states. Further, the salicide layers 2s, 3s and 6s are formed on the surfaces of the source electrode 2, the drain electrode 3 and the gate electrode 6 as reaction films of titanium (Ti) respectively. Connection resistance can be remarkably reduced by connecting the wires 11 with the source electrode 2, the drain electrode 3 and the gate electrode 6 through the salicide layers 2s, 3s and 6s.

The silicon nitride film 8 has a function of inhibiting the salicide layers 2s, 3s and 6s from over-etching when forming the contact holes 10.

A method of fabricating the semiconductor device according to the embodiment shown in FIG. 1 is now described with reference to FIGS. 2 to 4.

Figure 2:
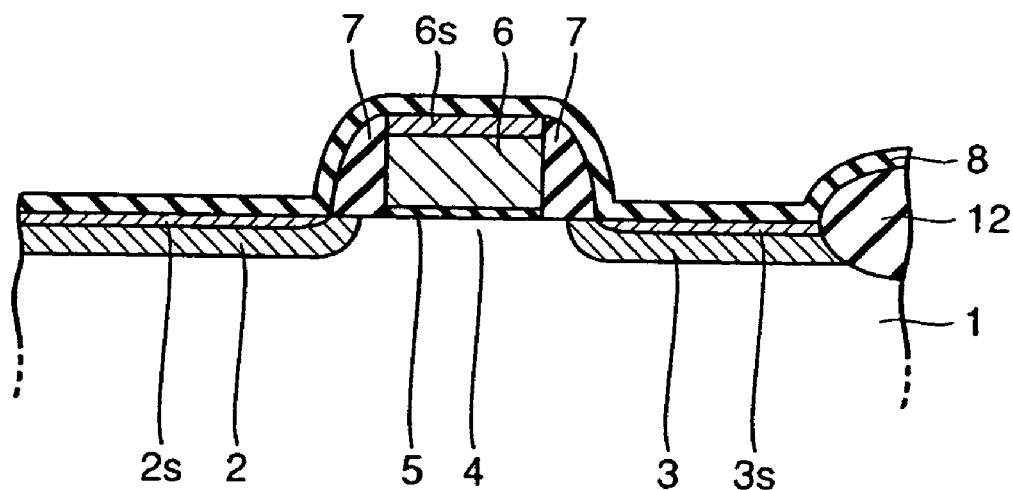
FIGS. 2 to 4 are sectional views for illustrating a fabrication process for the semiconductor device according to the embodiment shown in FIG. 1.

First, the element isolation film 12 is formed on the prescribed region of the semiconductor substrate 1, as shown in FIG. 2. The source electrode 2 and the drain electrode 3 are formed on the active region (element forming region) enclosed with the element isolation film 12 at a prescribed interval to hold the channel region 4 therebetween. The gate electrode 6 is formed on the channel region 4 through the gate insulator film 5. The gate electrode 6, the source electrode 2 and the drain electrode 3 form the MOS transistor. Thereafter the spacers 7 of silicon oxide ($SiO_2$) are formed on the side surfaces of the gate electrode 6.

Thereafter a titanium (Ti) film is formed by sputtering in a thickness of about 50 nm, for example, from above the semiconductor substrate 1. This titanium film is heated in a stream of $N_2$ to about 800° C., thereby selectively silicifying the surfaces of the gate electrode 6, the source electrode 2 and the drain electrode 3. Thus, the salicide layers 6s, 2s and 3s having thicknesses of at least 5 nm are formed in a self-aligned manner. The semiconductor substrate 1 is cooled and thereafter unreacted Ti is removed with an aqueous solution of $NH_4OH/H_2O_2$.

Then, the silicon nitride film 8 is formed in a thickness of at least 5 nm to cover the overall surface. This silicon nitride film 8 is formed by LPCVD (low-pressure CVD) under the following conditions:

Material gas: $5 \times 10^{-7}$ m$^3$/s of dichlorosilane $4.1 \times 10^{-6}$ m$^3$/s of ammonia Pressure: 26.6 Pa Temperature: 750° C.

The flow rate of each of the aforementioned material gas and ammonia is expressed in a volume (cubic meters) per unit time (seconds) in terms of a standard state.

Figure 3:
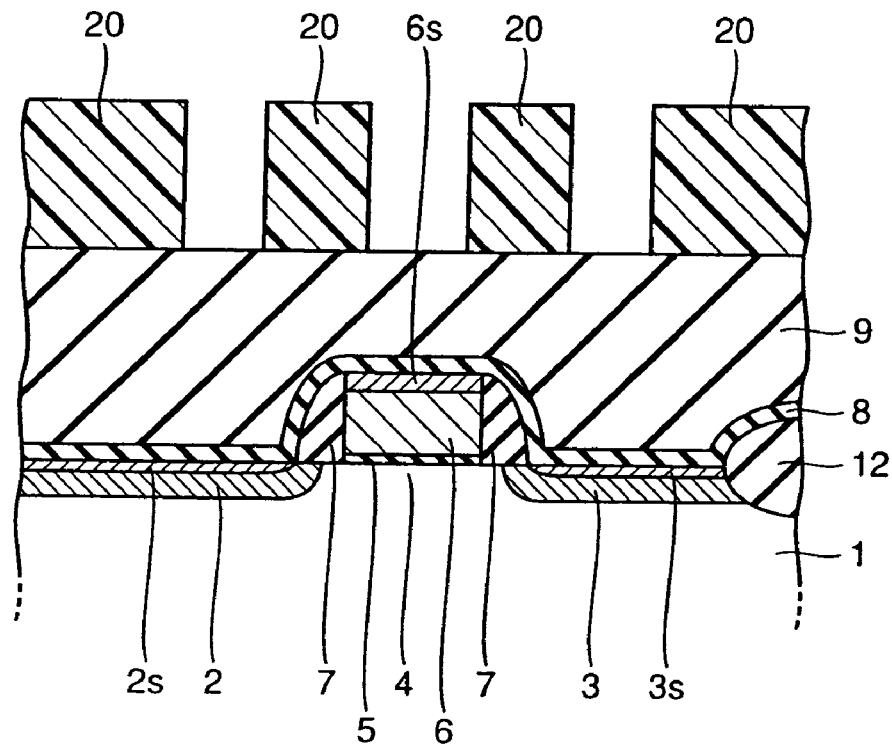
Figure 4:
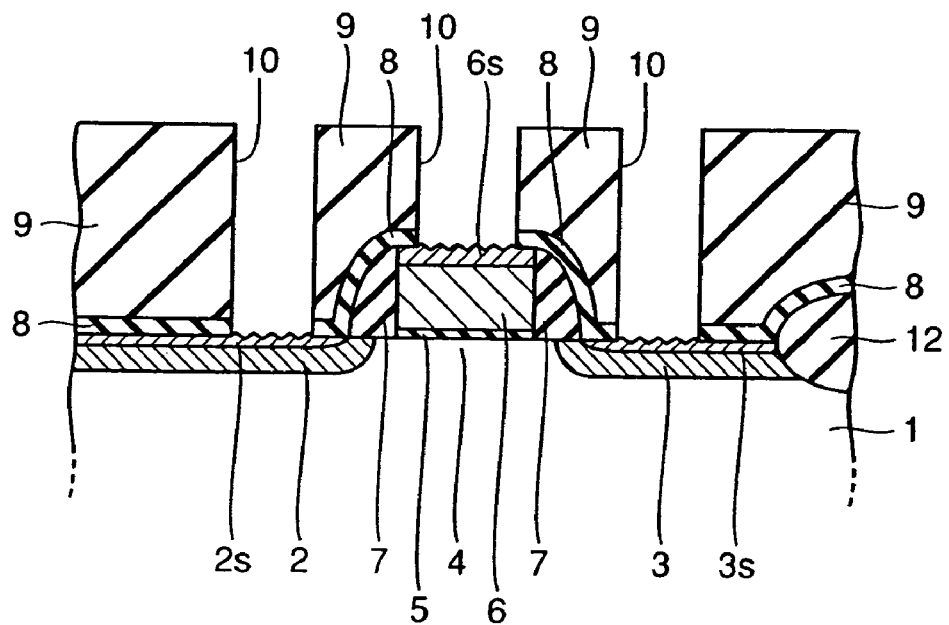

Then, the interlayer isolation film 9 of silicon oxide is formed on the upper surface of the silicon nitride film 8 in a thickness of at least 10 nm, as shown in FIG. 3. The interlayer isolation film 9 is flattened and thereafter resist patterns 20 for forming the contact holes 10 are formed on prescribed regions of the upper surface of the interlayer isolation film 9. The interlayer isolation film 9 is dry-etched through the resist patterns 20 serving as masks, thereby forming the contact holes 10 as shown in FIG. 4. The dry etching for forming the contact holes 10 is performed through a high-concentration plasma device under the following conditions:

Etching gas: $C_4F_8/O_2/Ar$

Pressure: $9.3 \times 10^{-1}$ Pa

Microwave: 1.5 kW

RF: 400 W

When the aforementioned etching for forming the contact holes 10 reaches the silicon nitride film 8 from the interlayer isolation film 9, the silicon nitride film 8 having a higher etching selection ratio than the interlayer isolation film 9 reduces the etching rate. Further, the salicide layers 6s, 2s and 3s having a higher etching selection ratio than the silicon nitride film 8 further reduce the etching rate. Thus, the surfaces of the salicide layers 6s, 2s and 3s can be effectively inhibited from over-etching in the etching for forming the contact holes 10. This point is now described in detail.

For the dry etching for forming the contact holes 10 in this embodiment, the high-concentration plasma device is employed mainly with etching gas of $C_4F_8$, as hereinabove described. In the etching through the high-concentration plasma device, ionized etching gas receives downward force from an electric field perpendicularly applied to the semiconductor substrate 1. The ionized gas collides with the interlayer isolation film 9, thereby scattering silicon oxide forming the interlayer isolation film 9 outward as gas layers. Thus, the contact holes 10 are defined.

At this time, the etching gas and a C—F based polymer formed in the process of reaction between the etching gas and silicon oxide adhere to the inner peripheral surfaces of the contact holes 10 formed in the interlayer isolation film 9. The adhering polymer defines side wall protective films. These side wall protective films inhibit the interlayer isolation film 9 from horizontal etching.

When carrying out the aforementioned dry etching for forming the contact holes 10 with $CHF_3$ gas or $CF_4$ gas through a low-concentration plasma device, it is difficult to suppress a microloading effect (irregular etching) as the aspect ratio of the contact holes 10 is increased. According to this embodiment, therefore, the etching is carried out through the high-concentration plasma device.

In the etching with $CHF_3$ gas or $CF_4$ gas through a high-concentration plasma device, however, it is difficult to ensure high selection ratios of the base salicide layers 2s, 3s and 6s, which in turn are disadvantageously over-etched in general.

According to this embodiment, therefore, the surfaces of the salicide layers 2s, 3s and 6s are covered with the silicon nitride film 8 after formation thereof, thereby attaining an effect similar to the aforementioned side wall protection effect on the upper surfaces of the salicide layers 2s, 3s and 6s. In other words, the silicon nitride film 8 having a higher selection ratio than silicon oxide forming the interlayer isolation film 9 is formed under the interlayer isolation film 9 when etching the interlayer isolation film 9 mainly with $C_4F_8$ gas, thereby prompting deposition of the C—F based polymer on the upper surface of the silicon nitride film 8. Thus, the etching rate is automatically reduced when the etching gas reaches the silicon nitride film 8, with no control related to the etching rate or the like.

The salicide layers 2s, 3s and 6s have a higher etching selection ratio than the silicon nitride film 8, and hence reduction of the etching rate more remarkably appears on the salicide layers 2s, 3s and 6s. In other words, deposition of the C—F based polymer on the upper surfaces of the salicide layers 2s, 3s and 6s is prompted. Thus, the salicide layers 2s, 3s and 6s can be more effectively prevented from over-etching. Consequently, the contact holes 10 can be formed without passing through the salicide layers 2s, 3s and 6s by over-etching.

After forming the contact holes 10 in the aforementioned manner, the resist patterns 20 are removed. Finally, the wires 11 are formed in the contact holes 10 as shown in FIG. 1, thereby completing the semiconductor device according to this embodiment.

Figure 5:
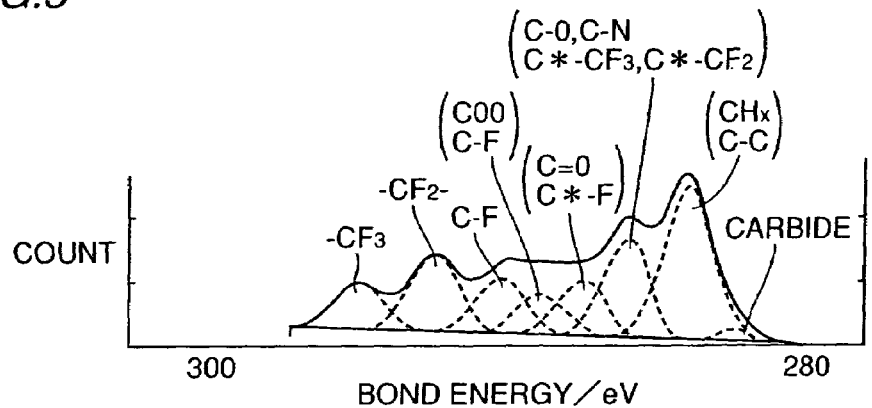
FIG. 5 is a graph showing results of element analysis of substances deposited on salicide layers after formation of contact holes in the semiconductor device according to the embodiment provided with a silicon nitride film.
Figure 6:
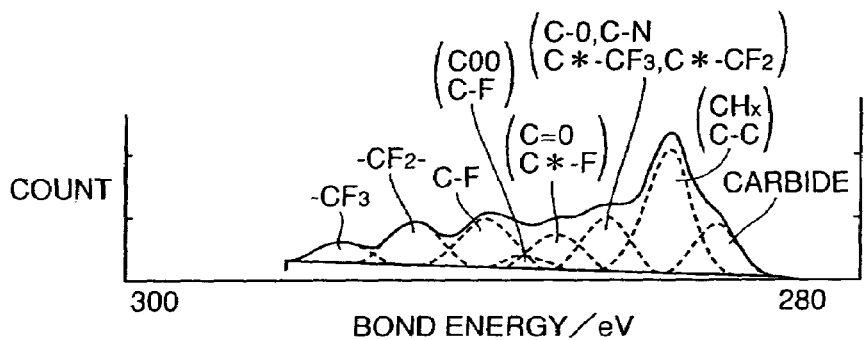
FIG. 6 is a graph showing results of element analysis of substances deposited on salicide layers after formation of contact holes in a conventional semiconductor device provided with no silicon nitride film.
Figure 7:
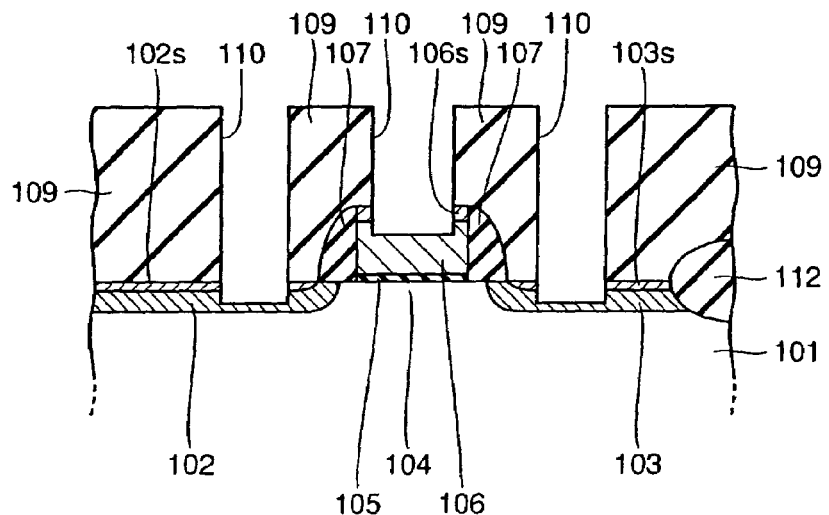
FIG. 7 is a sectional view for illustrating a problem in a conventional semiconductor device.

Substances deposited on the salicide layers 2s, 3s and 6s after formation of the contact holes 10 are now described with reference to. FIGS. 5 and 6. Referring to each of FIGS. 5 and 6, the horizontal axis shows chemical bond energy of each substance, and the vertical axis shows the ratio (count) of the chemical bond energy. In each graph, element analysis inclusive of the chemical composition is enabled by independently counting the ratio of the substance corresponding to each chemical bond energy. Referring to FIGS. 5 and 6, broken lines show theoretical values, and solid lines show actually measured values.

FIG. 5 shows results of element analysis of substances deposited on the salicide layers 2s, 3s and 6s after formation of the contact holes 10 in the semiconductor device according to this embodiment provided with the silicon nitride film 8. FIG. 6 shows results of element analysis of substances deposited on salicide layers after formation of contact holes in a conventional semiconductor device provided with no silicon nitride film 8. It is understood from FIGS. 5 and 6 that a large quantity of C—F based polymer is deposited on the salicide layers 2s, 3s and 6s when performing etching with provision of the silicon nitride film 8, as compared with the case of performing etching with no provision of the silicon nitride film 8. Therefore, it is understood possible to effectively reduce the etching rate on the salicide layers 2s, 3s and 6s.

When forming the wires 11 through the contact holes 10, the substances deposited on the salicide layers 2s, 3s and 6s are removed. The substances deposited on the salicide layers 2s, 3s and 6s are removed by oxygen plasma treatment, for example. This oxygen plasma treatment is performed under conditions of a reaction chamber pressure of 10 mT, microwave power (2.45 GHz) of 1500 W, a substrate bias of 400 W and an $O_2$ flow rate of 100 sccm. The substances deposited on the salicide layers 2s, 3s and 6s may alternatively be removed by ashing such as ozone ashing or down-flow ashing.

In the fabrication method according to this embodiment, as hereinabove described, etching can be stopped in the salicide layers 2s, 3s and 6s without extremely reducing the etching rate when forming the contact holes 10, by providing the silicon nitride film 8 having a higher etching selection ratio than the interlayer isolation film 9 of silicon oxide on the salicide layers 2s, 3s and 6s. Thus, the contact holes 10 can be formed without passing through the salicide layers 2s, 3s and 6s.

Further, the etching can be readily performed with high precision by employing the silicon nitride film 8 generally employed as an insulator film as a film having a higher etching selection ratio than the interlayer isolation film 9.

Although the present invention has been described and illustrated in detail, it is clearly understood that the same is by way of illustration and example only and is not to be taken by way of limitation, the spirit and scope of the present invention being limited only by the terms of the appended claims.

For example, the aforementioned salicide layers 2s, 3s and 6s may alternatively be formed by a method other than that described with reference to the aforementioned embodiment. Further, the aforementioned film forming method, thicknesses and etching conditions are properly changeable.

While the silicon nitride film 8 is employed as the film having a higher selection ratio than the interlayer isolation film 9 in the aforementioned embodiment, the present invention is not restricted to this but another film such as an SOG film, for example, may be employed.

While the etching gas for etching the contact holes 10 is mainly composed of $C_4F_8$ in the aforementioned embodiment, the present invention is not restricted to this but another etching gas may be employed. For example, the etching gas may be mainly composed of arbitrary gas having a composition expressed as $C_xH_yF_z$.

While the interlayer isolation film 9 is etched with the gas mainly composed of $C_4F_8$ through the high-concentration plasma device in the aforementioned embodiment, the present invention is not restricted to this but another etching may be employed. In other words, the interlayer isolation film 9 may be etched by any method so far as a film having a higher selection ratio than the interlayer isolation film 9 with respect to the employed etching gas is formed between the interlayer isolation film 9 and the silicide films thereby inhibiting the silicide films from over-etching due to an effect similar to the side wall protection effect.

The gate electrode 6, the source electrode 2 and the drain electrode 3 may not necessarily have a silicide structure.

While the electrodes 2, 3 and 6 and the wires 11 are connected with each other through the contact holes 10 in the aforementioned embodiment, the present invention is not restricted to this but is also applicable to a structure of connecting wires with each other through contact holes. In this case, lower wires can be inhibited from over-etching when forming the contact holes in an interlayer isolation film by forming a film having a higher selection ratio than the interlayer isolation film between the interlayer isolation film and the lower wires.

The electrodes or the wires located under the contact holes may not necessarily have a higher etching selection ratio than the film formed on the surfaces thereof.

While the semiconductor substrate 1 consists of silicon in the aforementioned embodiment, the present invention is not restricted to this but the semiconductor substrate may consist of a silicon-germanium alloy, silicon carbide, germanium, cadmium selenide, cadmium sulfide or gallium arsenide.

What is claimed is:

1. A method of fabricating a semiconductor device comprising steps of:
    forming an insulator film including an upper insulator film and a lower insulator film consisting of different material with each other on a first conductive part;
    etching said insulator film thereby forming an opening reaching said first conductive part; and
    forming a second conductive part connected with said first conductive part through said opening,
    wherein said etching is conducted under substantially the same conditions, including power, with respect to said upper insulator film and said lower insulator film; and
    wherein said first conductive part is a gate electrode.

2. A method of fabricating a semiconductor device according to claim 1, wherein
    said lower insulator film has a higher etching selection ratio than said upper insulator film under a certain etching condition.

3. The method of fabricating a semiconductor device according to claim 2 wherein
    said first conductive part contains a material having a higher etching selection ratio than said lower insulator film.

4. The method of fabricating a semiconductor device according to claim 2, further comprising a step of silicifying said first conductive part in advance of said step of forming said insulator film.

5. The method of fabricating a semiconductor device according to claim 4, wherein
    said step of silicifying said first conductive part includes a step of silicifying the surfaces of said gate electrode.

6. The method of fabricating a semiconductor device according to claim 2, wherein
    said lower insulator film includes a silicon nitride film,
    said upper insulator film includes a silicon oxide film, and
    said step of forming said opening includes a step of forming said opening by etching said upper insulator film and said lower insulator film by dry etching with gas having a composition of $C_xH_yF_z$.

7. The method of fabricating a semiconductor device according to claim 6, wherein
    said gas consisting of $C_xH_yF_z$ includes gas consisting of $C_4F_8$.

8. The method of fabricating a semiconductor device according to claim 6, wherein
    said silicon nitride film forming said lower insulator film is formed to be in contact with the surface of said first conductive part.

9. The method of fabricating a semiconductor device according to claim 2, wherein
    said step of forming said opening is carried out by dry etching through a high-concentration plasma device.

10. The method of fabricating a semiconductor device according to claim 2, wherein
    said lower insulator film includes an SOG film.

11. The method of fabricating a semiconductor device according to claim 1, wherein
    said etching is conducted under a condition where a C—F based polymer is formed when etching said lower insulator film.

12. The method of fabricating a semiconductor device according to claim 11, wherein
    said etching is conducted under a condition where a C—F based polymer is formed when said first conductive part is exposed to said etching.

* * * * *